United States Patent [19]

Houston et al.

[11] 4,126,825

[45] Nov. 21, 1978

[54] ELECTRONIC CURRENT TRANSDUCER FOR HIGH VOLTAGE TRANSMISSION LINES

[75] Inventors: John M. Houston; Harry R. Summerhayes, both of Schenectady, N.Y.

[73] Assignee: Electric Power Research Institute, Inc., Palo Alto, Calif.

[21] Appl. No.: 844,785

[22] Filed: Oct. 25, 1977

[51] Int. Cl.² ............................................ G01R 31/00
[52] U.S. Cl. ..................................................... 324/96
[58] Field of Search .................. 324/96; 250/227, 230; 350/96.10

[56] References Cited

U.S. PATENT DOCUMENTS

| | | | |
|---|---|---|---|
| 3,492,574 | 1/1970 | Heintz et al. | 324/96 |
| 3,681,688 | 8/1972 | Hermstein et al. | 324/96 |

FOREIGN PATENT DOCUMENTS 1,170,540  11/1969  United Kingdom ...................... 324/96

Primary Examiner—Stanley T. Krawczewicz
Attorney, Agent, or Firm—Flehr, Hohbach, Test, Albritton & Herbert

[57] ABSTRACT

An electronic current transducer for high voltage transmission lines including a fast analog data channel for providing effective relaying information which is stablized by a slow, highly accurate, channel which is insensitive to changes in gain. In addition for dc transmission lines where polarity may reverse, offsetting or biasing allows for bipolar measurement.

7 Claims, 6 Drawing Figures

ELECTRONIC CURRENT TRANSDUCER FOR HIGH VOLTAGE TRANSMISSION LINES

BACKGROUND OF THE INVENTION

In high voltage ac and dc power transmission lines it is necessary to deliver at ground potential an accurate value or replica of the amplitude and phase of the line current. This is then used for operating a variety of sophisticated relays that protect the line and make measurements of faults. It is also used for measuring the amount of ac power that the line is delivering to the customer (dc metering is not yet available). The foregoing applications require fast response and high accuracy.

Magnetic core current transformers have been used for the above tasks but at line voltage of 500 kv-ac and 250 kv-dc and above conventional ac current transformers and dc magnetic amplifiers are very heavy and expensive.

However, there have been a number of efforts to develop an electronic current transducer or transformer in which the required information is measured at line potential and transmitted to ground on a modulated beam of light or via radio waves. In a typical system a high speed electronic (analog or digital) converter at line potential converts the instantaneous current amplitude to a low level signal which is used to modulate a light-emitting diode. The modulated light is transmitted by a long fiber optic light guide to a ground unit where the modulated light is detected and converted back to an analog waveform duplicating the current waveform on the line. Some of the serious problems with such a system are that it is very difficult and expensive to combine the required wide dynamic range (e.g., 10,000), the fast sampling rate (2 msec. response time), and the accuracy (0.3% over a −40° to 50° C. temperature range).

Another technique uses Faraday Rotation where a beam of light, for example from a laser, is sent up through a hollow insulator from the ground, modified by the magnetic field of the current by polarization, and is returned to ground where this rotation is sensed. The foregoing techniques are illustrated in Hermstein U.S. Pat. No. 3,681,688 and Heintz U.S. Pat. No. 3,492,574. Hermstein improves accuracy as illustrated in FIG. 3 of his patent by the use of a second laser channel for temperature compensation. Heintz has a two channel fiber optic system: one channel carries pulse length information related to the magnitude of the line current and a second channel polarity.

Yet another problem in the prior art, especially with the advent of high voltage dc transmission grids, is that the dc current may flow in either direction in some of the branches. Then in addition to the above accuracy and response requirements a line current sensor must have the capability of measuring bipolar currents. This is especially difficult where light transmitting channels such as fiber optics are used since there can be no "negative light."

OBJECT AND SUMMARY OF THE INVENTION

It is an object of the present invention to provide an improved electronic current transformer apparatus for measuring the line current of a high voltage transmission line.

In accordance with the above object there is provided an electronic current transducer apparatus for measuring the line current of a high voltage transmission line comprising an analog fast channel having means for transmitting line current data in continuous form with a relatively unstable gain characteristic. A parallel slow channel transmits line current data in discrete form with a relatively stable gain characteristic but with relatively narrow dynamic range and frequency response. The fast channel data is calibrated with the slow channel data to produce a gain stabilized replica of the line current.

DETAILED DESCRIPTION OF THE PREFERRED EMBODIMENTS

Figure 1:
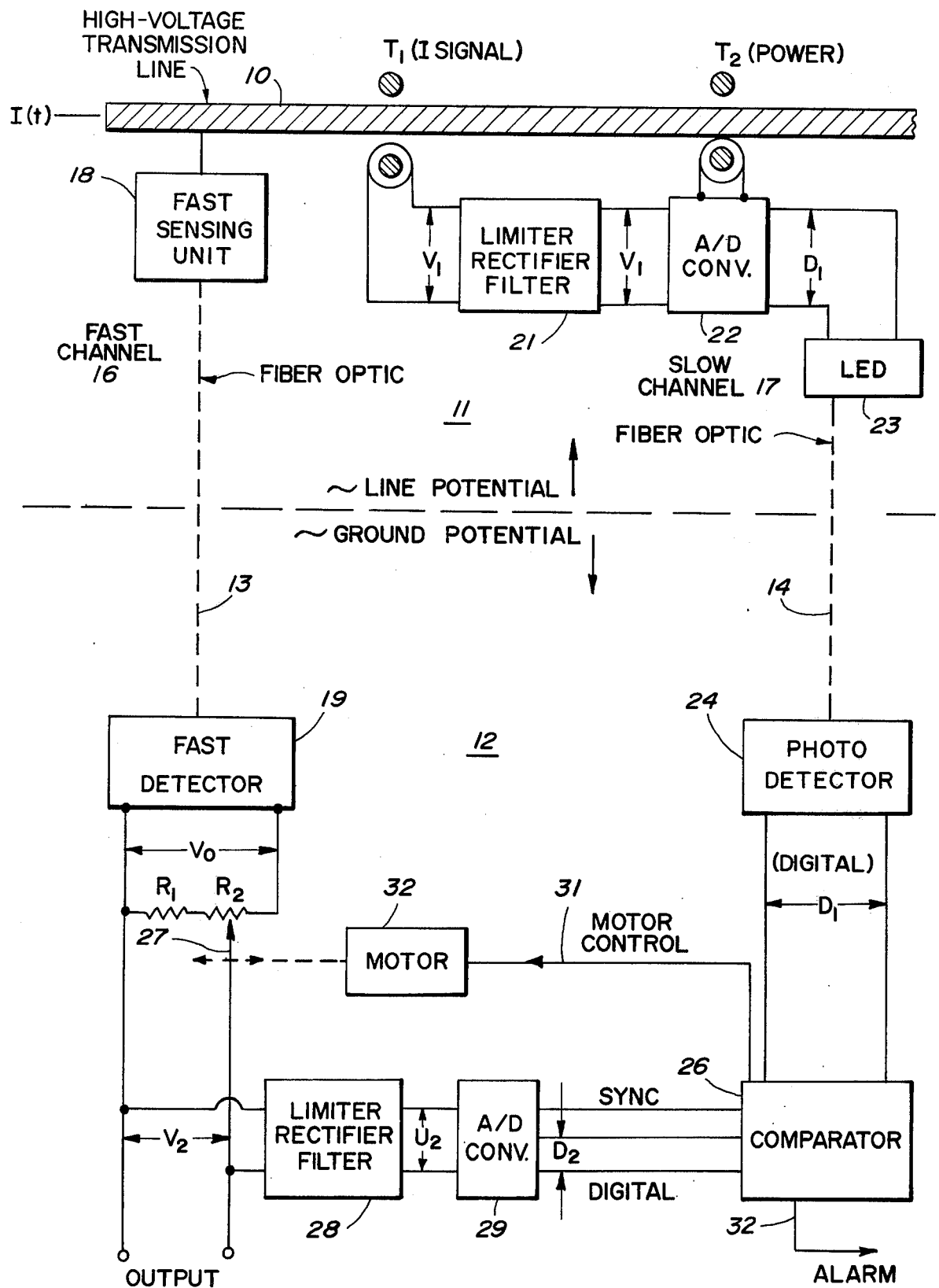
FIG. 1 is a block diagram of one embodiment of the invention.

Referring to FIG. 1, the high voltage transmission line 10 is illustrated as having a current $I(t)$. Connected to this transmission line at substantially line potential is a line portion 11 which is connected to a ground portion 12, which is substantially at ground potential, by a pair of fiber optic light guides 13 and 14. In practice, such guides would be several meters in length. The actual current $I(t)$ is sensed by both a fast channel 16 and a slow channel 17.

Fast channel 16 includes a fast sensing unit 18 which senses the line current by either a simple current transformer in the case of ac or a resistor shunt in the case of a dc line. It includes a modulator which modulates light from a light source in, for example, an amplitude modulation mode and transmits line current data on fiber optic light guide 13. This is detected by fast detector 19 which produces an output voltage of $V_0$ which is a direct function of $I(t)$. Fast channel 16 is an analog system (that is, one having no analog to digital conversion) and is by its nature continuous; namely, in any short time interval the output voltage $V_0$ is proportional to line current. Such a fast system exhibits good frequency response in that when a "step" occurs in $I(t)$ the $V_0$ must follow rapidly. $V_0$ is accurately proportional to $I(t)$ within a few msecs. Also the system operates over a wide dynamic range, for example 0.01 to 57 p.u., where one per unit (p.u.) is the rated line current under normal conditions. Thus 57 P.u. would be a relatively high fault current and 0.01 p.u. would be almost no load.

Suitable fast channel systems in addition to an amplitude modulated light beam are Faraday Rotation systems well known in the art or a modulated solid state transmitter such as, for example, using a Gunn diode modulated by the function $I(t)$ and where the resultant microwave energy is transmitted to ground potential either in free space or down a dielectric wave guide.

However, as discussed in the description of the prior art, all of the foregoing are fast systems which have a relatively unstable gain characteristic especially at the system limits of, for example, 0.01 p.u. and 57 p.u. In other words, there is a tradeoff between speed and system accuracy.

To provide such accuracy, a slow channel 17 is provided. This channel includes current transformer $T_1$ with an output voltage of $V_1$ which is a replica of the current waveform $I(t)$ on the line 10. $V_1$ is appled to a limiter-rectifier-filter circuit 21 which produces a slowly varying dc voltage $U_1$. Normally, because of the filtering, the time response of $U_1$ to a step change is several seconds; e.g. 6. The voltage $U_1$ is periodically measured, for example once per second, by an analog to digital converter 22 powered by a line transformer $T_2$. It has a digital pulse output $D_1$ which modulates a light emitting diode 23. The resultant digital light pulses are transmitted by a fiber optic channel 14 to photo-detector 24 which again reproduces the $D_1$ pulses and couples them to a digital comparator 26.

Slow channel 17, which because of its analog to digital conversion provides line current data in a discrete form, has an inherently relatively stable gain characteristic; but at the sacrifice of a relatively narrow dynamic range and frequency response. Where data is in discrete form, there is necessarily a lowered frequency response because with such data, it must be sampled over a sample time interval of, for example, 100 msecs. in order to produce any usable information.

Now referring in greater detail to ground portion 12, the fast detector 19 is connected to a potentiometer $R_1$, $R_2$, with a movable contact 27 which provides a variable output voltage $V_2$, a replica of $I(t)$. However, it has an amplitude that is a fraction of $V_0$ which is for example 80%. $V_2$ drives a limiter-rectifier-filter circuit 28 similar to circuit 21 (viz., the filter portion has a time constant of 6 seconds also) and provides a dc voltage $U_2$ which drives analog to digital converter 29 to produce a digital signal $D_2$ which is connected to comparator 26. Comparator 26 calculates difference in values between $D_1$ and $D_2$ and integrates this difference over a short period of time, for example, five minutes. A motor control output on line 31 drives a motor 32 which moves the contact 27 in a direction so as to reduce the error signal to effectively make $V_2$ equal to $V_1$. If the integrated error signal is above a predetermined level, alarm line 33 is actuated. This might be caused, for example, by a malfunction in the slow channel, the fast channel, or of motor 32.

In summary, slow channel 17 which is relatively accurate therefore calibrates the fast channel 16 whose output information $V_2$ may be used for rapid system control.

The system as described in FIG. 1 has several advantages:
1. Design of the fast channel system is greatly simplified by the fact that it is allowed to have a slow drift in gain.
2. Since the sampling rate of the slow channel 17 is relatively low, it may have a fairly simplified design. In contrast, in order to provide a fast response channel of this type (with an A/D converter) a sampling rate of at least 1,000 per second would be necessary and would require more costly components and much more bandwidth than would an analog system.
3. The design of the analog to digital converters is simplified since they need not operate over a wide dynamic range.
4. There is a system symmetry in that the same analog to digital converter and limiter-rectifier-filter units are used both in the line portion 11 and ground portion 12. Thus temperature sensitivity tends to cancel out.

Figure 2:
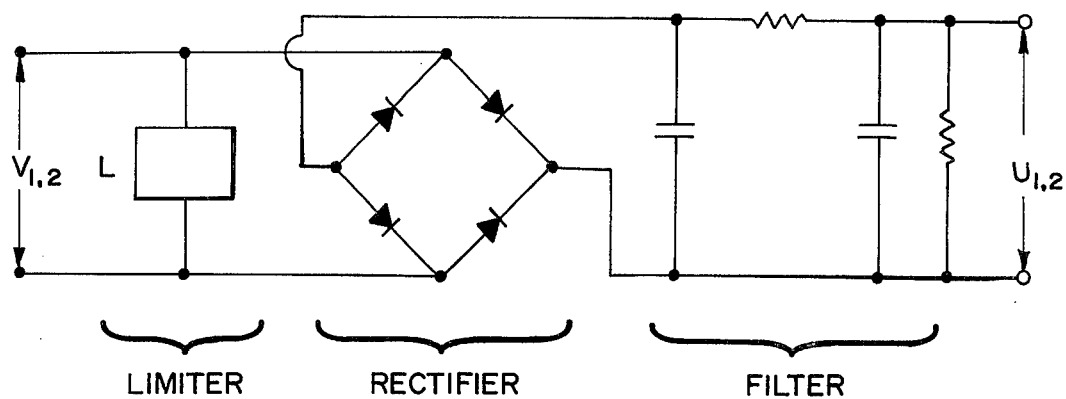
FIG. 2 is a schematic of a portion of FIG. 1.

FIG. 2 illustrates a typical limiter-rectifier-filter of unit 21 or 28.

Figure 3:
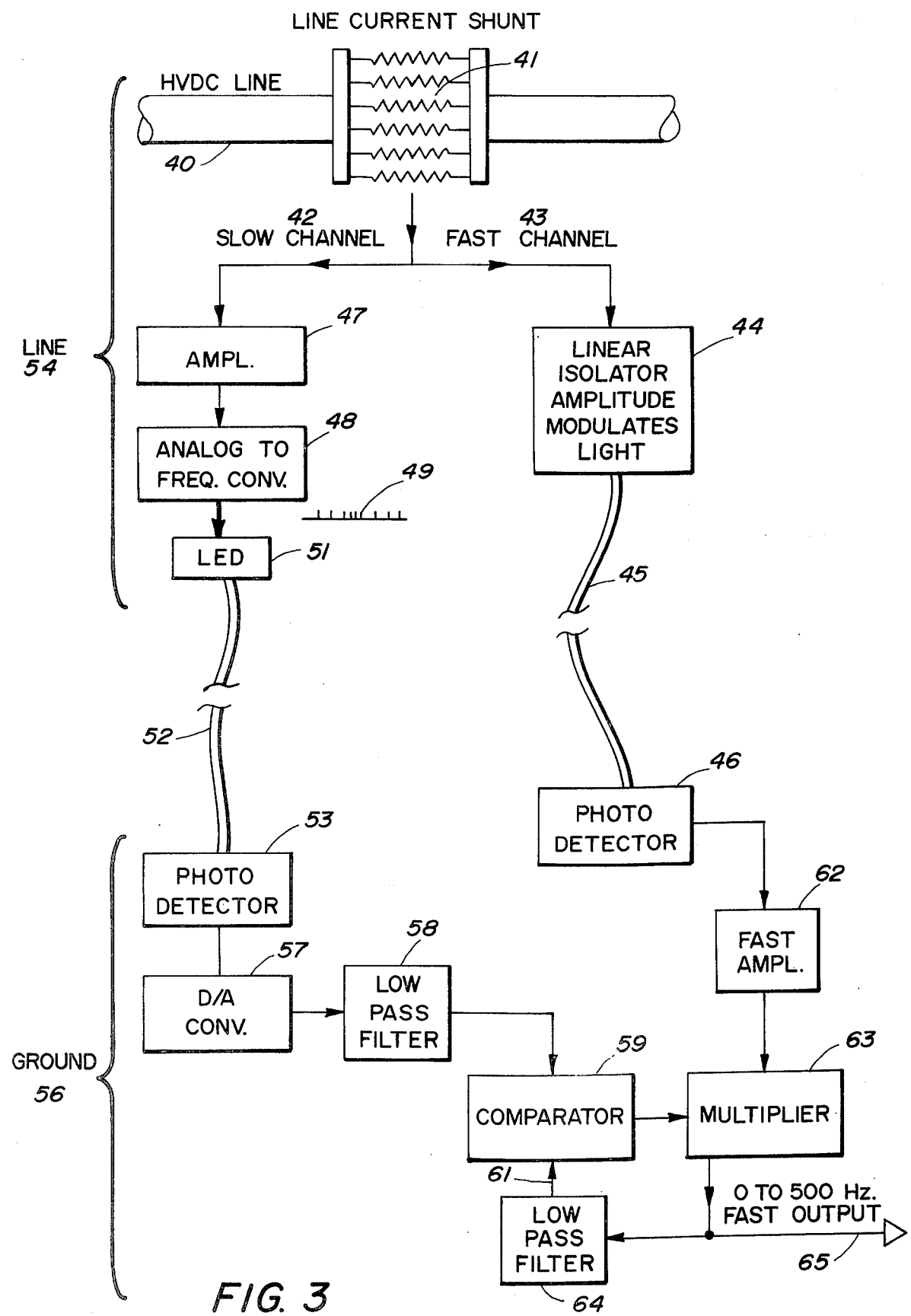
FIG. 3 is a block diagram of another embodiment of the invention.

FIG. 3 is another embodiment of the invention which is especially useful for high voltage dc transmission lines, such as line 40 shown. Here line current shunts 41 are utilized. The shunts feed a slow channel 42 and a fast channel 43. Fast channel 43 includes a linear isolator 44 which amplitude modulates light transmitted over a fiber optic guide 45 to produce a signal output from photo-detector 46. Slow channel 42 includes an amplifier 47 which drives an analog to frequency converter 48 or analog to digital (A/D) converter more generally. It has an output such as shown by the waveform 49. Converter 48 drives a light-emitting diode (LED) unit 51 to provide digital data over fiber optic light guide 52 which is sensed by a photo-detector 53. All of the foregoing is contained by a line unit 54, except for photo-detectors 46 and 53 which are included in ground unit 56.

The output of photo-detector 53 is converted to analog form by a digital to analog converter 57 which analog output is filtered by a low pass filter 58 and coupled to a comparator 59. The other input to comparator 59 is on line 61 which is from the fast channel 43 via a fast amplifier 62 connected to photo-detector 46, a multiplier 63 and a low pass filter 64. Multiplier 63 is in turn driven by the error output of comparator 59 so that it multiplies the fast channel signal level to cause a comparison with the slow channel calibrating signal. The resultant gain stabilized output is thus on line 65.

Figure 4:
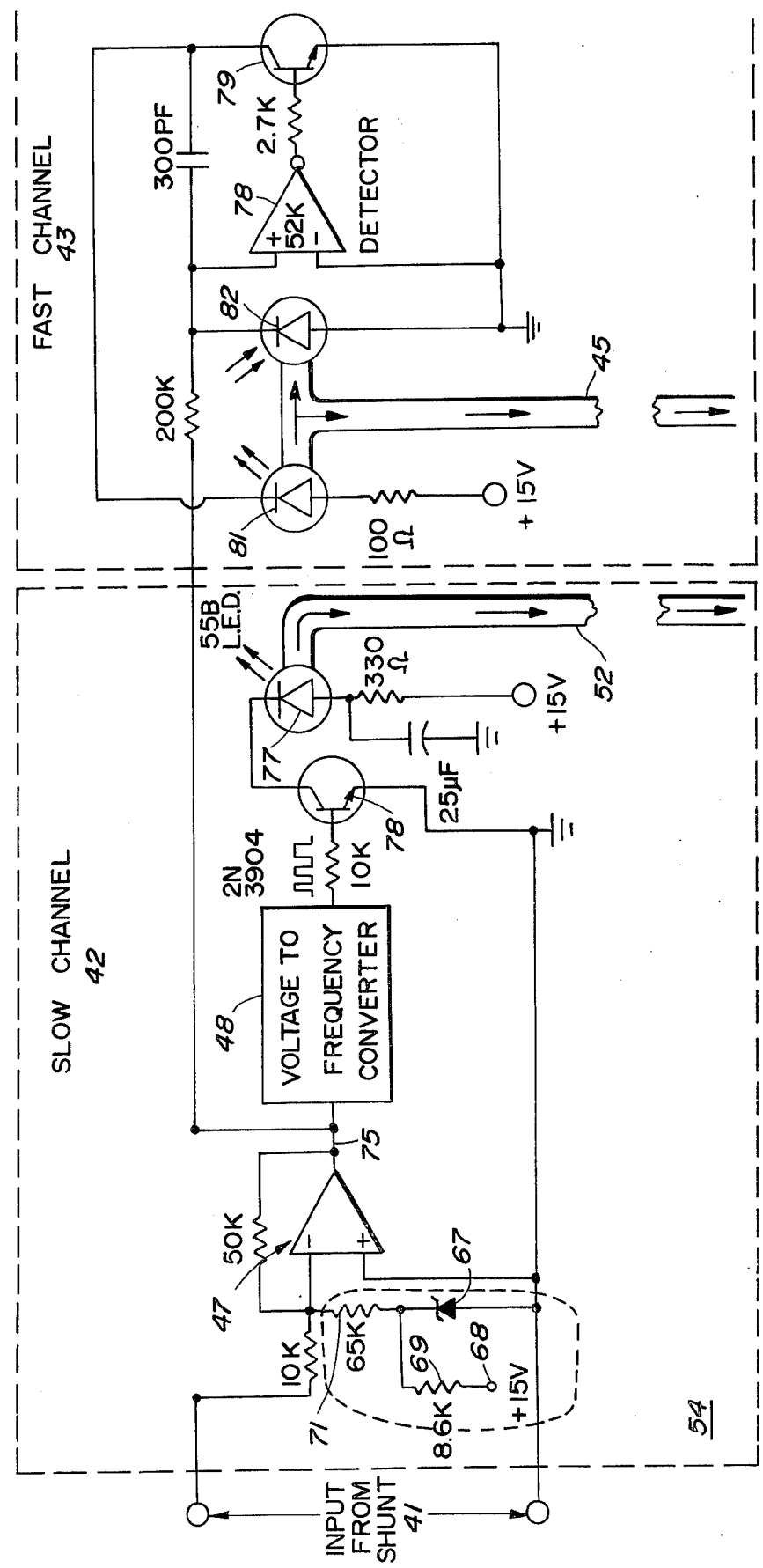
FIG. 4 is a circuit schematic of one portion of FIG. 3.
Figure 5:
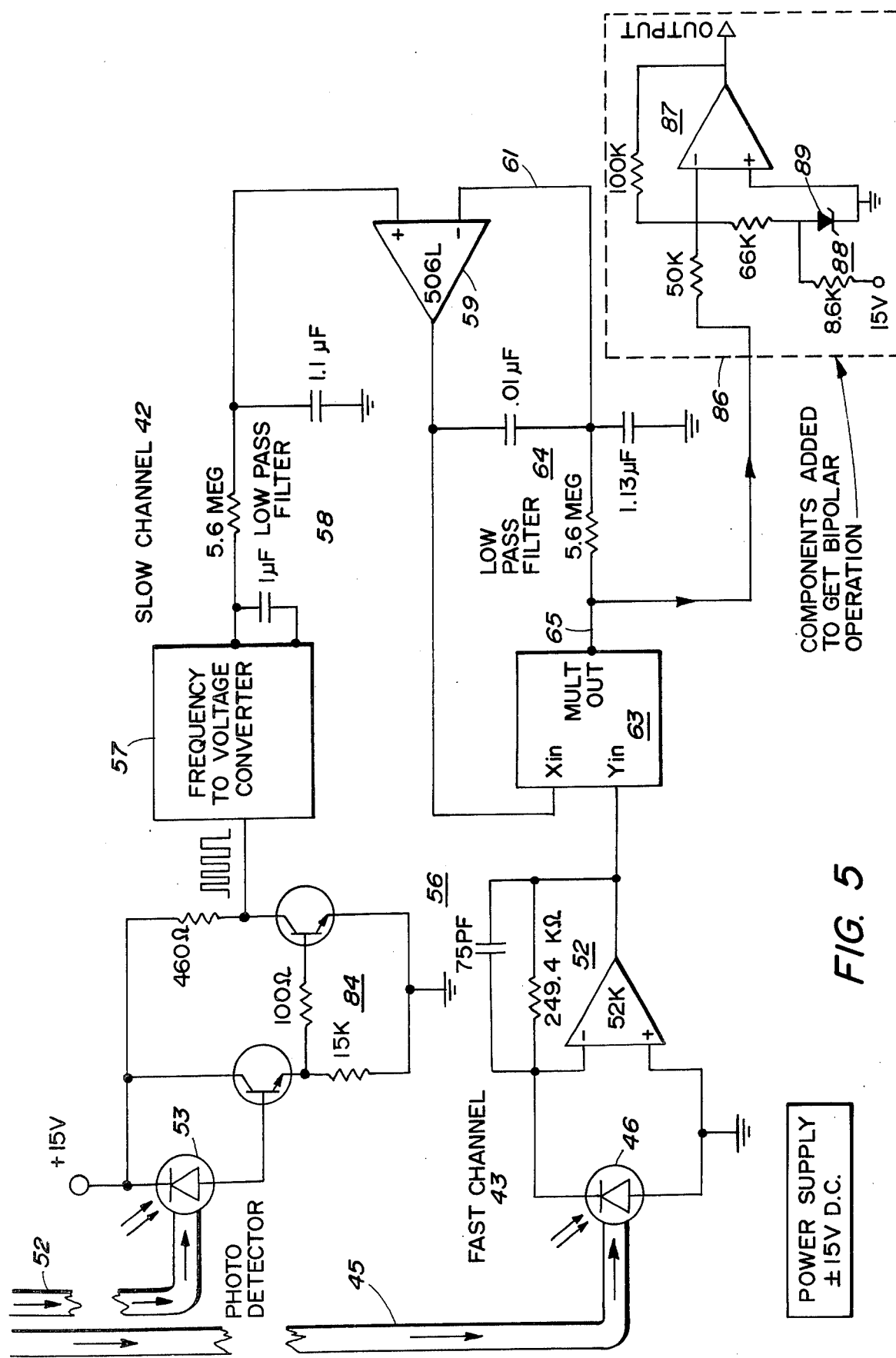
FIG. 5 is a circuit schematic of another portion of FIG. 3.

FIG. 4 shows line unit 54 in greater detail. The input from the line shunt 41 is actually connected to a common operational amplifier 47 which supplies both slow channel 42 and fast channel 43. Operational amplifier 47 has a voltage offset applied to it by a bias injection circuit which includes a Zener diode 67, a positive 15 volt input 68 connected to diode 57 by a resistor 69, and a common series resistor 71 connecting the bias voltage source to the inverting input of operational amplifier 47. Thus an offset voltage is applied to the dc input voltage from shunt 41.

Figure 6:
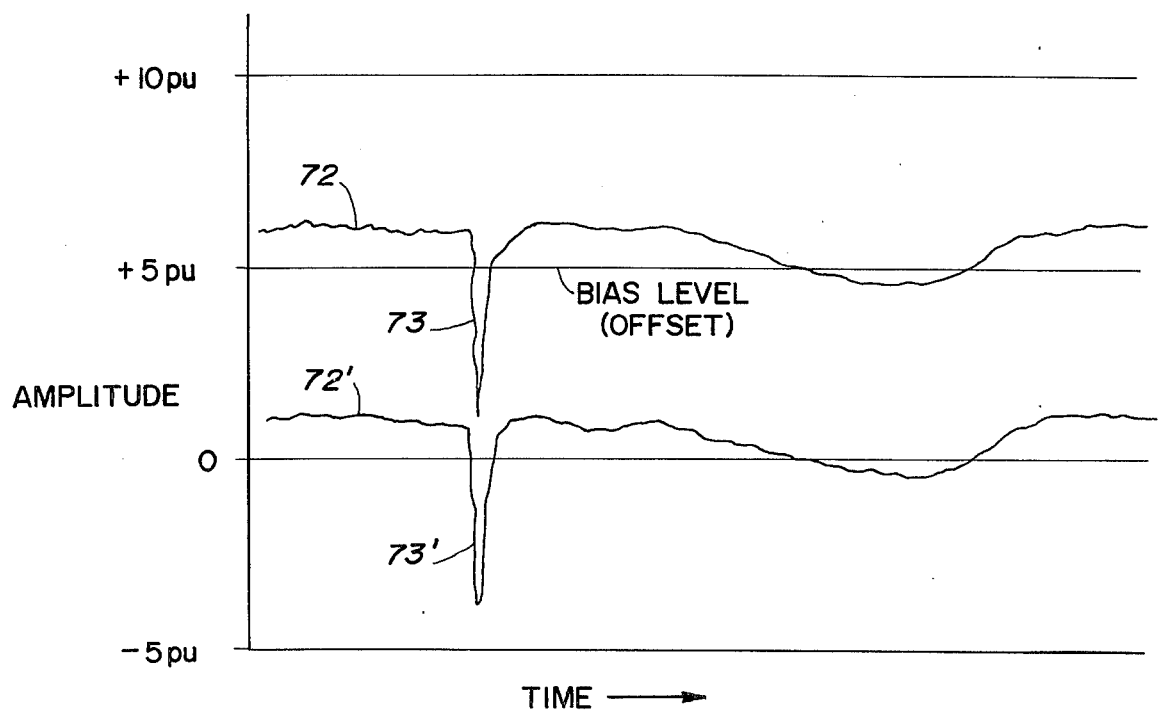
FIG. 6 illustrates waveforms useful in understanding the operation of the embodiment of FIG. 3.

Such bias level offset is illustrated in FIG. 6 as a +5 p.u. level. The actual input from the shunt 41 is shown by the waveform 72. If a reduction in line current such as indicated at 73 occurs, the overall signal would still remain positive; that is, above zero amplitude. In comparison, with a bias level offset as illustrated by signal 72′, a reduction in line current 73′ will produce a negative signal would could not effectively be transmitted by the optical system. Such offset signal which appears at the output 75 of operational amplifier 47 of the slow channel 42 drives the voltage to frequency converter 48. The amplitude modulated signal on fiber optic light guide 52 is produced by a light emitting diode 77 driven by a transistor switch 78 having its base input connected to converter 48. With respect to fast channel 43 the offset line current on line 75 is amplified in amplifier 78 which drives the base of the transistor 79 which has its collector connected to light emitting diode 81. Diode 81 is coupled to light guide 45 with the light guide also being coupled to a photodiode detector 82.

The circuit consisting of LED 81, photodiode 82 and amplifiers 78 and 79 with their associated capacitors, resistors and fiber optic couplers constitutes a distortion correction means for forcing the light output of the LED 81 to be a linear function of the input driving signal. This ensures an accurate reproduction of the line current signal at the ground end of the light pipe 45.

United States Patent [19]

Dobkin

[11] 4,126,826
[45] Nov. 21, 1978

[54] MEASUREMENT SYSTEM SIGNAL ISOLATION
[75] Inventor: Robert C. Dobkin, San Mateo, Calif.
[73] Assignee: National Semiconductor Corporation, Santa Clara, Calif.
[21] Appl. No.: 834,860
[22] Filed: Sep. 19, 1977
[51] Int. Cl.² .......................... G01R 1/20; G01K 7/20
[52] U.S. Cl. ............................ 324/127; 73/362 SC; 307/310; 324/117 R
[58] Field of Search .......................... 324/127, 117 R; 73/362 R, 362 AR, 362 SC; 307/310

[56] References Cited
U.S. PATENT DOCUMENTS

| | | | |
|---|---|---|---|
| 3,422,352 | 1/1969 | Paulkovich | 324/117 R |
| 3,742,764 | 7/1973 | Dauphinee | 73/362 AR |

Primary Examiner—Rudolph V. Rolinec
Assistant Examiner—Ernest F. Karlsen
Attorney, Agent, or Firm—Gail W. Woodward

[57] ABSTRACT

A transformer primary is first biased with a current sustained at least long enough for any secondary voltage to drop to zero. Then the primary is open circuited. The resultant secondary voltage is coupled to a constant voltage device such as a shunt regulator. A voltage related to the shunt regulator voltage will then appear in the open circuited primary and will be available for measurement fully isolated from the secondary. If the shunt regulator is made to operate as a function of a condition to be measured, an isolated remote measure of the condition is present at the primary of the transformer.

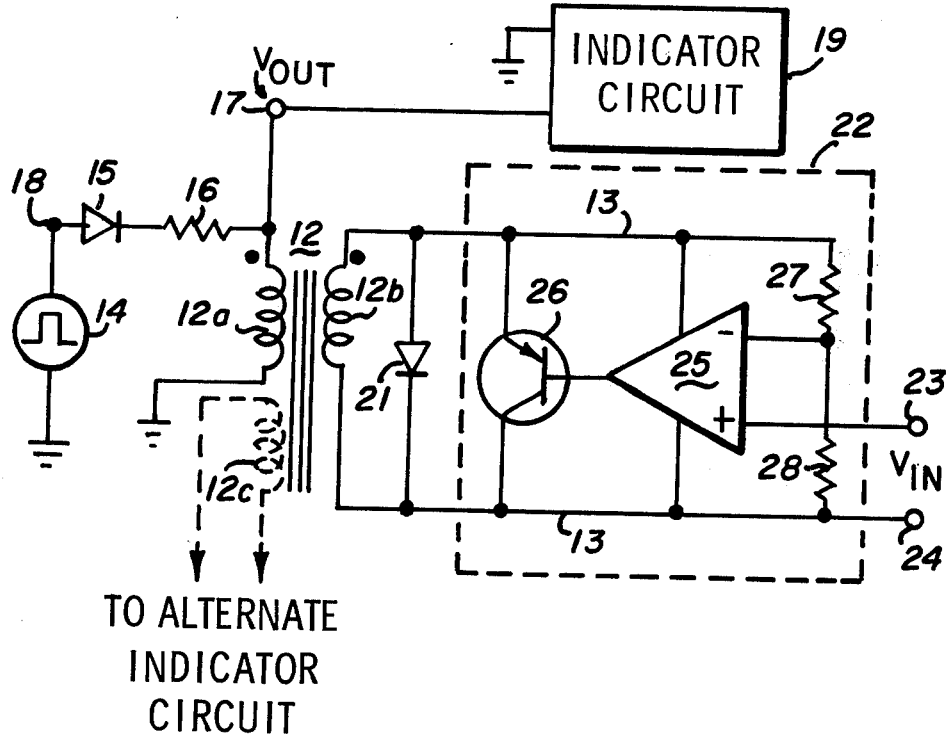

9 Claims, 3 Drawing Figures